(12) United States Patent
Yensen et al.

(10) Patent No.: US 10,122,407 B2
(45) Date of Patent: Nov. 6, 2018

(54) SYSTEM AND METHOD FOR ULTRA WIDEBAND RADIO FREQUENCY SCANNING AND SIGNAL GENERATION

(71) Applicant: ALLEN-VANGUARD CORPORATION, Ottawa (CA)

(72) Inventors: Trevor Noel Yensen, Ottawa (CA); Travis Patrick Corkery, Ottawa (CA)

(73) Assignee: Allen-Vanguard Corporation, Ottawa (CA)

( * ) Notice: Subject to any disclaimer, the term of this patent is extended or adjusted under 35 U.S.C. 154(b) by 0 days.

(21) Appl. No.: 15/327,417

(22) PCT Filed: Jul. 25, 2014

(86) PCT No.: PCT/CA2014/050707
§ 371 (c)(1),
(2) Date: Jan. 19, 2017

(87) PCT Pub. No.: WO2016/011525
PCT Pub. Date: Jan. 28, 2016

(65) Prior Publication Data
US 2017/0180000 A1    Jun. 22, 2017

(51) Int. Cl.
*H04B 1/00* (2006.01)
*H04B 1/7097* (2011.01)
*H04B 1/18* (2006.01)

(52) U.S. Cl.
CPC ............ *H04B 1/7097* (2013.01); *H04B 1/18* (2013.01); *H04B 2201/709709* (2013.01)

(58) Field of Classification Search
None
See application file for complete search history.

(56) References Cited

U.S. PATENT DOCUMENTS 5,028,887 A * 7/1991 Gilmore ................ H03L 7/1806
                                                      327/107
5,151,661 A * 9/1992 Caldwell ................ G01S 7/282
                                                      327/107
(Continued)

FOREIGN PATENT DOCUMENTS

CA    2955510 A1 *  1/2016  ............ H03J 1/0091
EP    1605591 A1 * 12/2005  ............ H03J 1/0075

OTHER PUBLICATIONS

J. Bayruns, P. Wallace and N. Scheinberg, "A monolithic DC-1.6 GHz digital attenuator," IEEE MTT-S International Microwave Symposium Digest, Long Beach, CA, USA, 1989, pp. 1295-1298 vol. 3.*

*Primary Examiner* — Berhanu Tadese
(74) *Attorney, Agent, or Firm* — Elan IP Inc.

(57) ABSTRACT

A system for radio scanning and signal generation including a direct digital synthesis (DDS) signal generator providing a signal within a first bandwidth; a frequency multiplier in signal communication with the DDS signal generator; the frequency multiplier adapted to convert the signal within the first bandwidth to a multiplied signal within a second bandwidth, wherein the second bandwidth encompasses a wider frequency range than the first bandwidth; a processor in communication with the DDS signal generator for programming the DDS signal generator to provide the signal within the first bandwidth; the processor further adapted to reprogram the DDS signal generator to alter the first bandwidth; a radio frequency (RF) port for transmitting the signal as a wideband signal.

11 Claims, 6 Drawing Sheets

(56) References Cited

U.S. PATENT DOCUMENTS

| | | | | |
|---|---|---|---|---|
| 5,424,664 A * | 6/1995 | Phillips | G06F 1/0328 | 327/106 |
| 5,770,977 A * | 6/1998 | Uurtamo | H03B 21/01 | 327/105 |
| 5,983,081 A * | 11/1999 | Lehtinen | H03J 5/0281 | 455/179.1 |
| 6,026,125 A * | 2/2000 | Larrick, Jr. | H04L 27/04 | 375/295 |
| 7,023,374 B2 * | 4/2006 | Jossef | G01S 7/022 | 342/15 |
| 7,579,916 B1 * | 8/2009 | Mroch | H03L 7/22 | 331/16 |
| 7,830,456 B1 * | 11/2010 | Vysyaraju | H04B 1/28 | 348/725 |
| 8,483,630 B2 * | 7/2013 | Cathelin | H04B 1/7174 | 455/102 |
| RE44,634 E * | 12/2013 | Fontana | H04B 1/71635 | 324/642 |
| 8,699,985 B1 * | 4/2014 | Mar | G06F 1/0328 | 455/209 |
| 2002/0047942 A1 * | 4/2002 | Vorenkamp | H04N 5/455 | 348/731 |
| 2005/0041728 A1 * | 2/2005 | Karlsson | H04K 3/42 | 375/219 |
| 2005/0212604 A1 * | 9/2005 | Cyr | H01L 24/48 | 331/16 |
| 2005/0276310 A1 * | 12/2005 | Choi | H04B 1/7176 | 375/130 |
| 2006/0067293 A1 * | 3/2006 | Santhoff | H04B 1/7176 | 370/347 |
| 2006/0080722 A1 * | 4/2006 | Santhoff | H04L 25/03834 | 725/116 |
| 2009/0245447 A1 * | 10/2009 | Schwartz | G06F 1/022 | 375/362 |
| 2010/0046581 A1 * | 2/2010 | Oh | H04B 1/7174 | 375/130 |
| 2010/0062726 A1 * | 3/2010 | Zheng | H04B 1/40 | 455/74 |
| 2010/0156481 A1 * | 6/2010 | Neumann | H03J 1/005 | 327/156 |
| 2011/0151779 A1 * | 6/2011 | Bongfeldt | H01Q 1/1242 | 455/39 |
| 2011/0193739 A1 * | 8/2011 | Strauch | G01S 7/006 | 342/146 |
| 2013/0064328 A1 * | 3/2013 | Adnani | H04B 1/006 | 375/340 |
| 2014/0064346 A1 * | 3/2014 | Dobyns | G01R 13/0236 | 375/224 |
| 2015/0249481 A1 * | 9/2015 | Chivers | H04B 1/71637 | 375/147 |
| 2017/0085408 A1 * | 3/2017 | Yensen | H04B 1/06 | |
| 2017/0180000 A1 * | 6/2017 | Yensen | H04B 1/7097 | |

\* cited by examiner

SYSTEM AND METHOD FOR ULTRA WIDEBAND RADIO FREQUENCY SCANNING AND SIGNAL GENERATION

FIELD OF THE INVENTION

The invention relates to the field of signal generation and reception for radio frequency (RF) communications.

BACKGROUND OF THE INVENTION

Radio frequency (RF) communications devices are ubiquitous and used in an array of varying applications. In some applications, a frequency band is selected before a communication signal is sent to ensure no cross-over with other RF signals. In order to accomplish this, a range of frequencies is scanned to determine one suitable for sending the signal, and once identified, the signal is communicated. Generally, the scanning time is negligible in comparison to the length of the signal being sent and is not of particular concern.

Another application is one where a wide range of frequencies needs to be scanned as quickly as possible to identify potential threats or signals of interest, called full-band scanning. This application requires minimal band revisit times such that the likelihood of missing short bursts of energy is minimized. This can be accomplished in a variety of manners, but the manner applicable to this patent is in its wideband data capture capability and very fast retuning capability.

In this application fractions of a second can have a direct impact on the outcome of crucial events, the scanning time becomes an important metric. In addition, where security is an issue, a wide frequency range is also desirable. This is particularly true for military and defense applications such as cognitive radio, electronic warfare (signal jamming) and other military full-band spectrum scanning applications.

Examples of currently available prior art devices in the defense space which attempt to resolve the high-speed tuning problem include the CHAMP-WB-DRFM produced by Curtis-Wright™ Defense Solutions, the Everest SI-9138 by DRS Technologies™, the Eclipse RXR6300 by Esterline™ Corporation, the RF-7102 by Spectrum Signal Processing™, and the ExBW-Rx by Argon ST™ Inc. These prior art RF transmitting and receiving devices in the military space are typically capable of tuning in the order of 50 μs, and many cannot operate at this tuning time within a full wideband spectrum of DC-6 GHz. Some also tend to be fairly expensive and complex to produce that their integration with other devices is limited.

There is therefore a need in the art to address one or more of the above identified problems with prior art devices, and in particular to provide for a signal generation device incorporating an ultra wideband radio scanning and/or generation device capable of providing one or more advantages over the prior art, such as one or more of improved tuning times, ease of manufacture, and simplicity of design leading to lower cost systems.

SUMMARY OF THE INVENTION

It is one object of the invention to alleviate at least one of the aforementioned problems with the prior art. In view of this, there is disclosed in one embodiment of the invention a system for radio scanning including a direct digital synthesis (DDS) signal generator providing a signal within a first bandwidth; a frequency multiplier in signal communication with the DDS signal generator; the frequency multiplier adapted to convert the signal within the first bandwidth to a multiplied signal within a second bandwidth, wherein the second bandwidth encompasses a wider frequency range than the first bandwidth; a processor in communication with the DDS signal generator for programming the DDS signal generator to provide the signal within the first bandwidth; the processor further adapted to reprogram the DDS signal generator to alter the first bandwidth; and a radio frequency (RF) port for transmitting the signal as a wideband signal.

According to one aspect of the invention, there is further provided a digital-analog converter (DAC) for receiving a digital signal to be transmitted and converting the digital signal into an analog signal; a data converter/mixer for converting the analog signal to an intermediate frequency signal; and a radio frequency (RF) mixer for mixing the intermediate frequency signal with the multiplied signal to generate an RF signal; the RF port transmitting the RF signal as the wideband signal.

According to another aspect of the invention, there is further provided one or more of: a bandpass filter between the DDS signal generator and the frequency multiplier; an RF bandpass filter between the RF mixer and the RF port; and a DAC bandpass filter between the data converter/mixer and the RF mixer.

According to another aspect of the invention, the first bandwidth is in the range of DC to 1.6 GHz.

According to another aspect of the invention, the second bandwidth is in the range of DC to 6 GHz.

According to another aspect of the invention, the processor is adapted to reprogram the DDS signal generator within about 1 μs.

According to another aspect of the invention, the processor is adapted to reprogram the DDS signal generator in less than 1 μs.

According to a second embodiment of the invention, there is provided a radio frequency (RF) port for receiving an incoming wideband signal; a direct digital synthesis (DDS) signal generator providing a signal within a first bandwidth; a frequency multiplier in signal communication with the DDS signal generator; the frequency multiplier adapted to convert the signal within the first bandwidth to a multiplied signal within a second bandwidth, wherein the second bandwidth encompasses a wider frequency range than the first bandwidth; a processor in communication with the DDS signal generator for programming the DDS signal generator to provide the signal within the first bandwidth; the processor further adapted to reprogram the DDS signal generator to alter the first bandwidth; a radio frequency (RF) mixer for mixing the incoming wideband signal with the multiplied signal to generate an intermediate frequency signal; a data converter/mixer for converting the intermediate frequency signal into frequency baseband signal; and an analog-digital converter (ADC) for receiving the baseband frequency signal and converting the baseband frequency signal into a digital signal According to one aspect of the second embodiment, there is further provided one or more of: a bandpass filter between the DDS signal generator and the frequency multiplier; an RF bandpass filter between the RF mixer and the RF port; and a DAC bandpass filter between the data converter/mixer and the RF mixer.

According to another aspect of the second embodiment, the first bandwidth is in the range of DC to 1.6 GHz.

According to another aspect of the second embodiment, the second bandwidth is in the range of DC to 6 GHz.

According to another aspect of the second embodiment, the processor is adapted to reprogram the DDS signal generator within about 1 µs.

According to a third embodiment of the invention, there is provided a transmit/receive switch for switching between a radio scanning system of claim 2 and a radio transmission system of claim 8.

According to one aspect of the third embodiment, the frequency multiplied signal is shared between transmit and receive operations in a half duplex, time divisive multiplexing manner.

According to another aspect of the third embodiment, the first bandwidth is in the range of DC to 1.6 GHz.

According to another aspect of the third embodiment, the second bandwidth is in the range of DC to 6 GHz.

According to another aspect of the third embodiment, the processor is adapted to reprogram the DDS signal generator within about 1 µs.

Other advantages, features and characteristics of the present invention, as well as methods of operation and functions of the related elements of the structure, and the combination of parts and economies of manufacture, will become more apparent upon consideration of the following detailed description and the appended claims with reference to the accompanying drawings, the latter of which is briefly described hereinbelow.

BRIEF DESCRIPTION OF THE DRAWINGS

The novel features which are believed to be characteristic of the according to the present invention, as to its structure, organization, use and method of operation, together with further objectives and advantages thereof, will be better understood from the following drawings in which a presently preferred embodiment of the invention will now be illustrated by way of example. It is expressly understood, however, that the drawings are for the purpose of illustration and description only, and are not intended as a definition of the limits of the invention. In the accompanying drawings.

DETAILED DESCRIPTION

Figure 1:
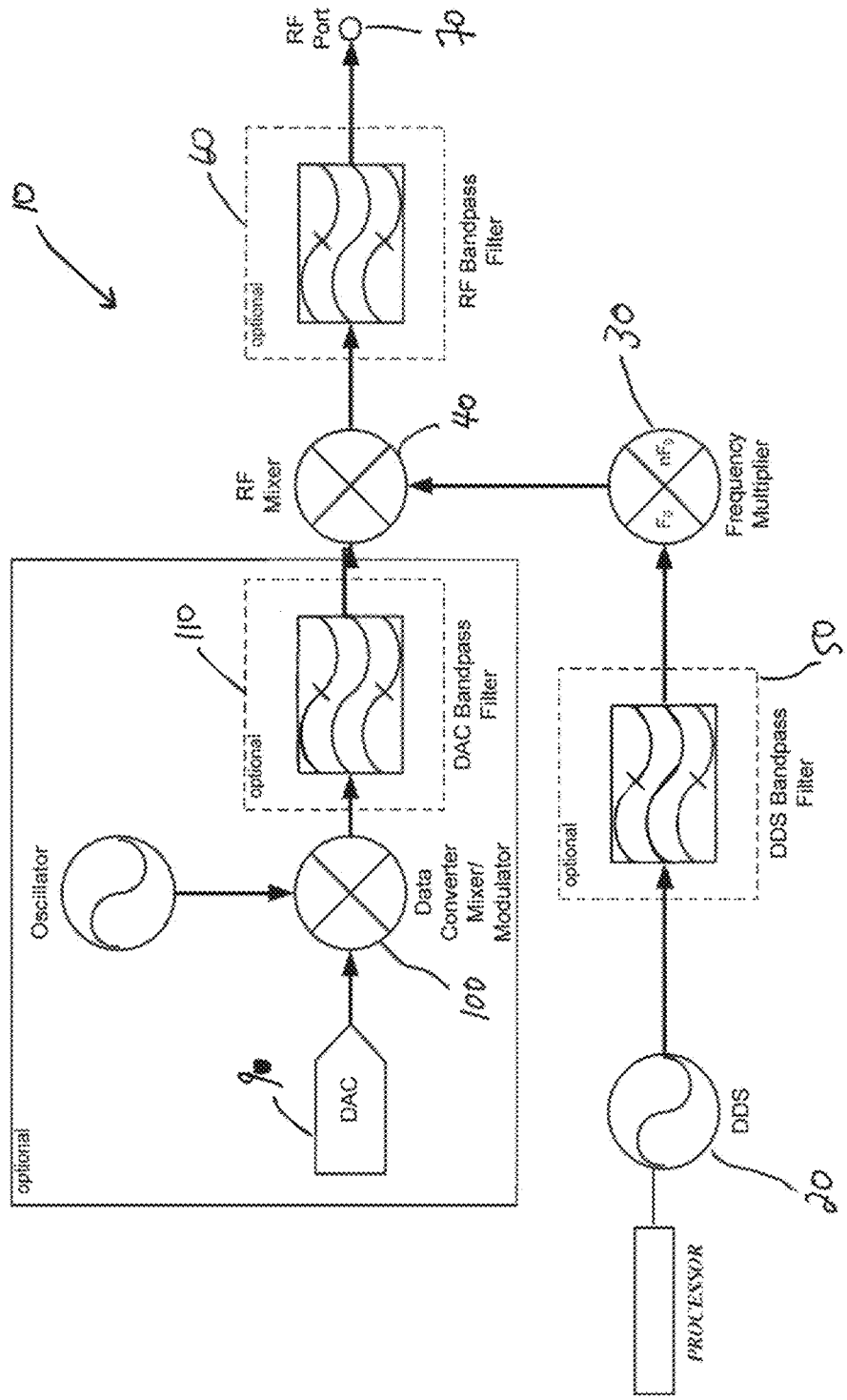
FIG. 1 is a schematic drawing of an embodiment of the invention arranged in a transmit configuration.

The need for the present invention arises in part due to a desire to provide near-instantaneous bandwidth reception, scanning, and/or signal generation for radio frequency (RF) communications over a wide operating range. Requirements for operation over a wide range of RF bandwidths are increasing due to demands from applications such as cognitive radio, electronic warfare and spectrum monitoring. The cognitive radio application has enhanced requirements which dictate that signal reception and generation will have the capability of being relocated to different radio bands within short periods of time. A radio with the capability of generating and receiving signals over a wide bandwidth and moving almost instantaneously between bands is of significant value to this application. These ultra wide bandwidth receivers and generators also have applications in electronic attack (e.g. responsive signal jamming), signal and interference detection and hunting and signal demodulation, classification and fingerprinting. The invention may be implemented as a combination of hardware and/or software and is preferably provided on a circuit board provided on a card which can readily be integrated into RF communications devices. Such details of integration are peripheral to the invention and thus are not described in further detail.

Adaptations of the invention permit operation as a transmitter, a receiver or as a transceiver providing flexibility to a wide array of potential applications. The preferred operating parameters, and indeed those enabled by the structure described below, provides for operation over a wide frequency range, typically DC to 6 GHz. However, it will be appreciated that adjustments may readily be made to cover a wider or more narrow operating range as dictated by specific applications.

In general, the system operates by providing a direct digital synthesis (DDS) signal generation engine to generate a digital signal. The DDS generation engine can be reprogrammed to operate within particular operating ranges in a relatively short period of time. In the system disclosed herein, this reprogramming to move the operating range occurs in about 1 µs, and is limited in part by the physical link to the DDS generation engine. Improvements in materials or otherwise with respect to the physical digital link may lead to even faster reprogramming times. Current state-of-the-art DDS generation engines have a limited operating range, such as DC to 1.6 GHz, such that in practice the system steers the signal generated by the DDS generation engine to a wideband operating range, such as DC to 6 HGz, which covers the entire intended operating range target. This may be accomplished through frequency multiplication. The frequency multiplied signal can be mixed with a signal from a data converter (ie. a digital-analog or an analog-digital converter) if so desired Transmit Configuration Referring now to FIG. 1, there is shown one embodiment of the invention in which the system is adapted to operate as a transmitter of RF communications. The system 10 includes a direct digital synthesis (DDS) signal generation engine 20 in communication with a frequency multiplier 30. The frequency multiplier 30 is adapted to convert the signal from the DDS generation engine, which has a limited operating range as mentioned above, into an ultra wideband operating range such as DC to 6 GHz.

The circuitry of FIG. 1 may be mated to a DAC for the purposes of arbitrary waveform generation. A potentially good match to the invention described within is to use an ultra wideband DAC to allow for ultra wideband signal generation in addition to the fast band relocation provided by the DDS and multipliers. A digital to analog converter (DAC) 90 generates a baseband signal, which is then modulated and/or upconverted by modulator/converter 100 to an intermediate frequency prior to being mixed with the frequency multiplied signal by the RF mixer 40 to generate the output RF signal via RF port 70. Optionally, the DAC signal may be modulated and/or mixed at baseband (IF=0 Hz) and thus avoid upconversion of the DAC signal to the intermediate frequency. It is also contemplated that the DAC may be used to generate a signal directly at the intermediate frequency by using the signal generated by the DAC outside of the first Nyquist zone. This technique is often referred to as undersampling, harmonic sampling, bandpass sampling or intermediate frequency sampling.

A processing unit (not shown) may be connected to either or both of the DAC and the DDS to generate a signal to be transmitted and control the reprogramming of the DAC, respectively.

A number of filters 50, 60, 110 may be associated with either the DDS signal generator 20, the output signal from the converter/mixer 100 or the signal resulting from the mixer 40. These filters are generally known in the art and are selected depending on requirements for signal chain noise, spurs and image rejection, for example.

In operation, the output frequency band of the DDS 20 is bandpass filtered by the filter 50 before it is frequency multiplied to achieve a broader frequency coverage at RF bands. This broader frequency coverage enables the wideband objectives of the present invention, while permitting tuning times corresponding with the narrow range at the DDS. Accordingly, reprogramming the DDS within its narrower range becomes the time limiting factor, while the outcome of wideband scanning is still achieved after the signal is frequency multiplied. Once the frequency multiplied signal is mixed with the data signal from the DAC, a complex signal is generated that may be transmitted as required. As discussed above, the DAC may generate signals in a variety of ways which may be know in the art, prior to being mixed by the RF mixer 40 with the frequency multiplied signal from the DDS 20.

Receive Configuration

Figure 2:
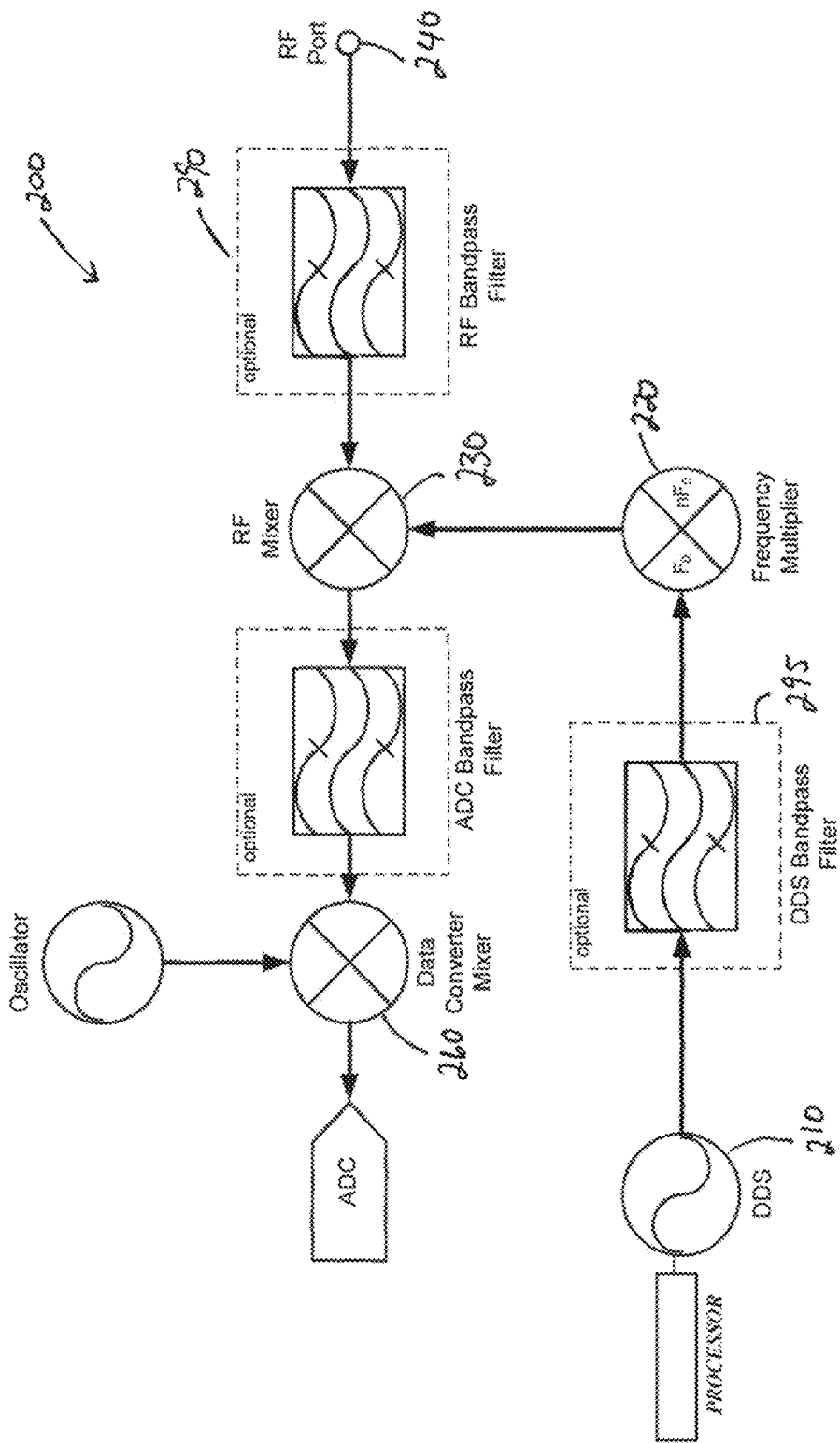
FIG. 2 is a schematic drawing of an embodiment of the invention arranged in a receive configuration.

Referring now to FIG. 2, there is shown an embodiment of the invention adapted to performing ultra wideband signal capture. The system 200 of FIG. 2 makes use of the same general concept as that of FIG. 1, wherein a signal from DDS 210 is frequency multiplied by multiplier 220 in order to widen the frequency band being scanned. In this configuration, reception of signals from a wideband range is made possible along with tuning times in the wideband frequency inline with those mentioned above.

An input signal is received at RF port 240, optionally bandpass filtered by filter 290, before being mixed by RF mixer 230 with the frequency multiplied DDS signal. The DDS signal is generated by DDS 210 and optionally bandpass filtered by filter 295 before being frequency multiplied by frequency multiplier 220. The output signal from the RF mixer is preferably an intermediate frequency (IF) signal. The IF signal is then mixed by the data converter/mixer 260 to generate a baseband signal that is sampled by the analog to digital converter (ADC). In one variant, it is possible to sample the IF signal directly by the ADC using a second or subsequent Nyquist zone. The system 200 has the capability of being mated to an ADC for the purposes of performing ultra wideband signal capture. A potentially good match to the invention described within is to use an ultra wideband ADC to allow for ultra wideband signal reception in addition to the fast band relocation provided by the DDS and multipliers Other than being configured to receive signals, the functioning and advantages of the embodiment illustrated in FIG. 2 are analogous to those as were described with respect to FIG. 1.

Transceiver Configuration

Figure 3:
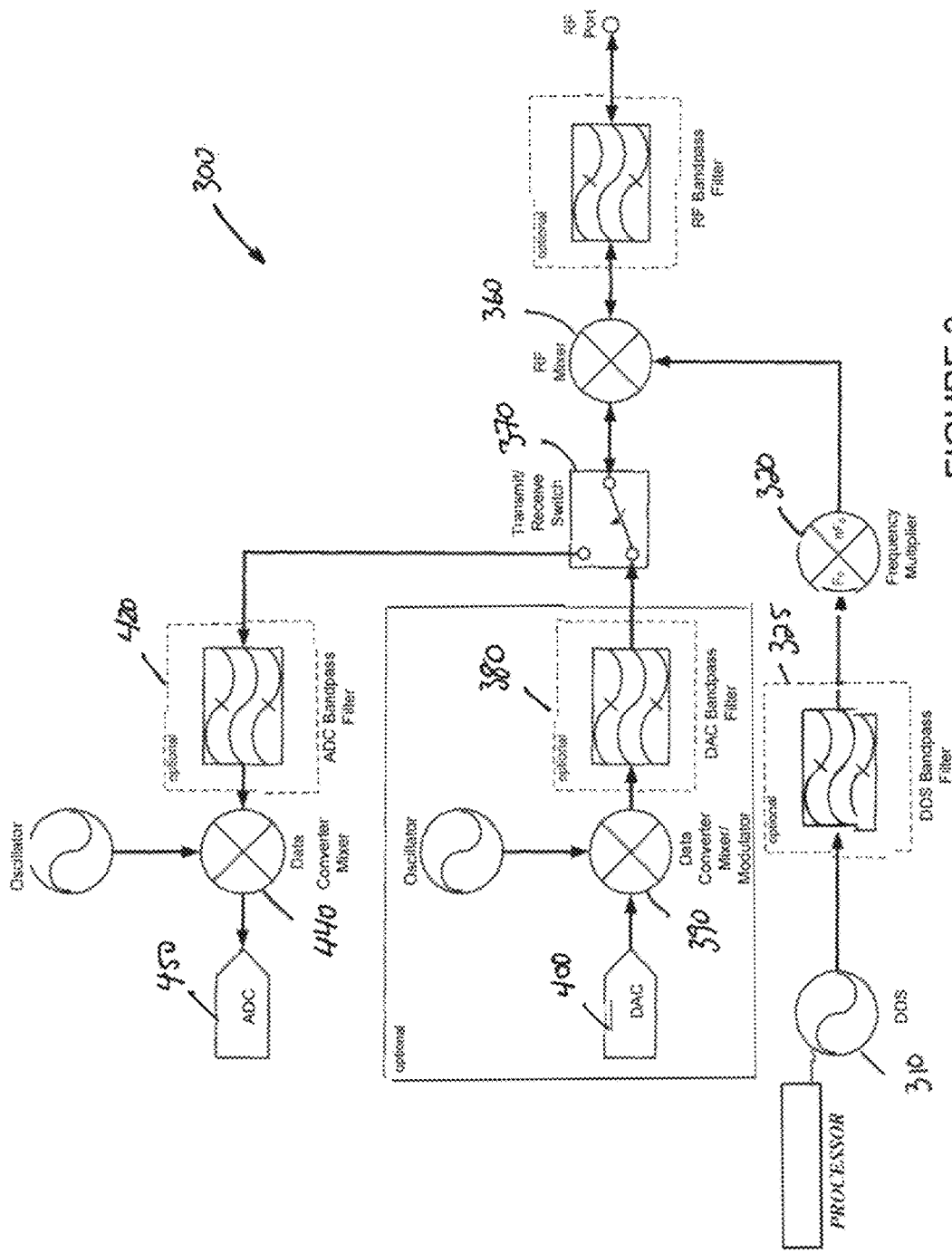
FIG. 3 is a schematic drawing of an embodiment of the invention arranged in a transceiver configuration.

FIG. 3 shows a third embodiment of the invention in which the system 300 is arranged in a transceiver configuration. Similarly to the previous two embodiments, DDS 310 generates a signal within a limited bandwidth, which is then frequency multiplied by multiplier 320. An optional filter 300 is used to bandpass filter the signal leaving the DDS 310. The frequency multiplied signal is then mixed at an RF mixer 360, with either a received signal or a transmitted signal, depending upon the mode in which the transceiver is operating. The frequency multiplied signal is effectively shared between transmit and receive operations in a half-duplex, time divisive multiplexing fashion. The position of switch 370 dictates which operation is occurring at a particular time.

In the transmit mode, DAC 400, data converter/mixer 390 and filter 380 function as was described with similarly named elements in FIG. 1. In the receive mode, ADC 450, data converter/mixer 440 and filter 420 function as was described with respect to similarly named elements in FIG. 2.

The Direct Digital Synthesis Signal Generator

A suitable DDS is chosen for use in this invention with wide bandwidth and a high-speed, low latency link allowing retuning of the DDS across a wide frequency range to occur in a short period of time. It is possible to purchase state-of-the art DDS devices capable of this type of operation from vendors or to create a DDS using a combination of a field programmable gate array (FPGA) or application-specific integrated circuit (ASIC) and a high-speed digital-to-analog converter (DAC).

Examples

Figure 4:
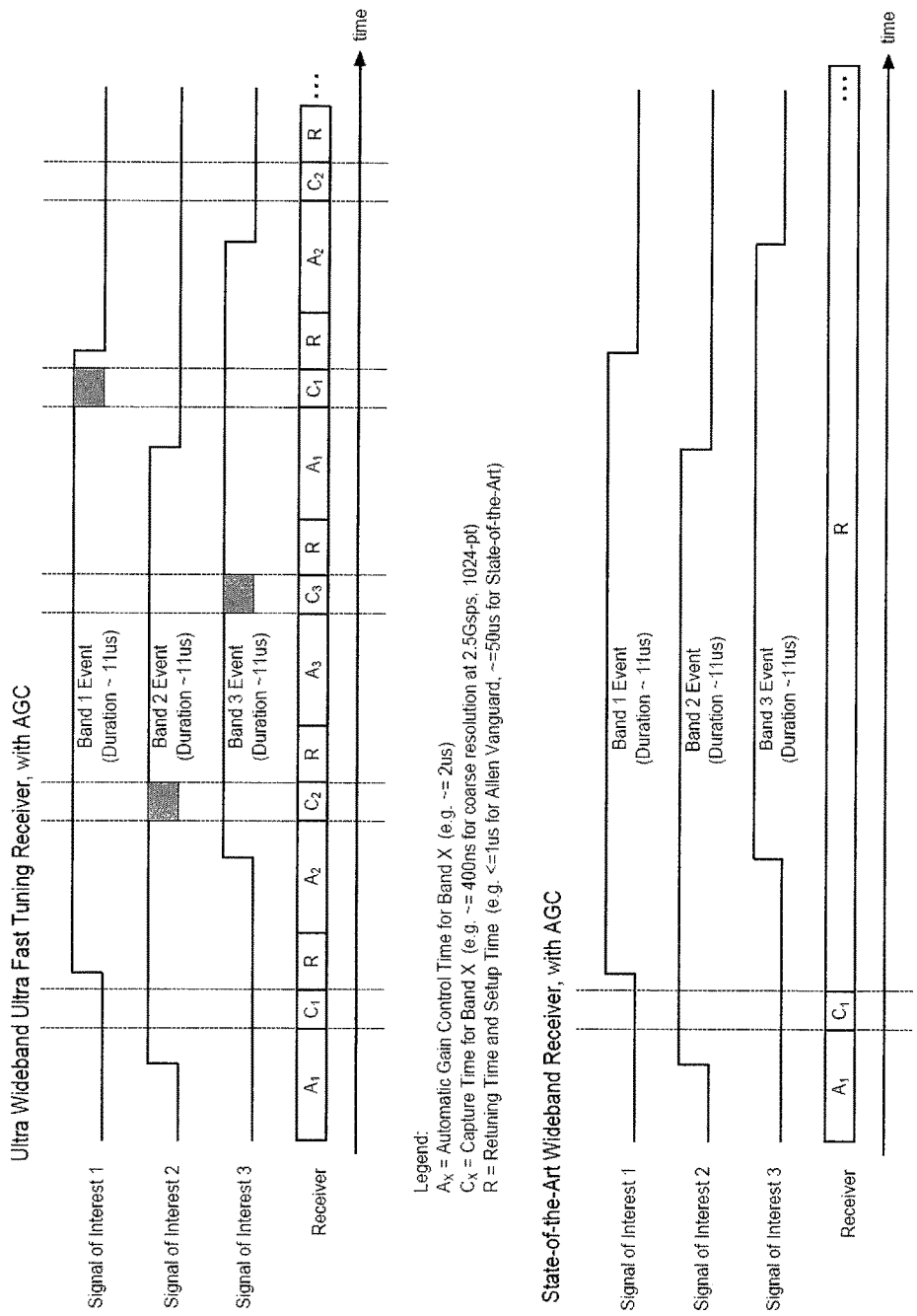
FIGS. 4 and 5 show the probability of an intercept of a fast revisit time as provided by the invention when compared to the prior art.
Figure 5:
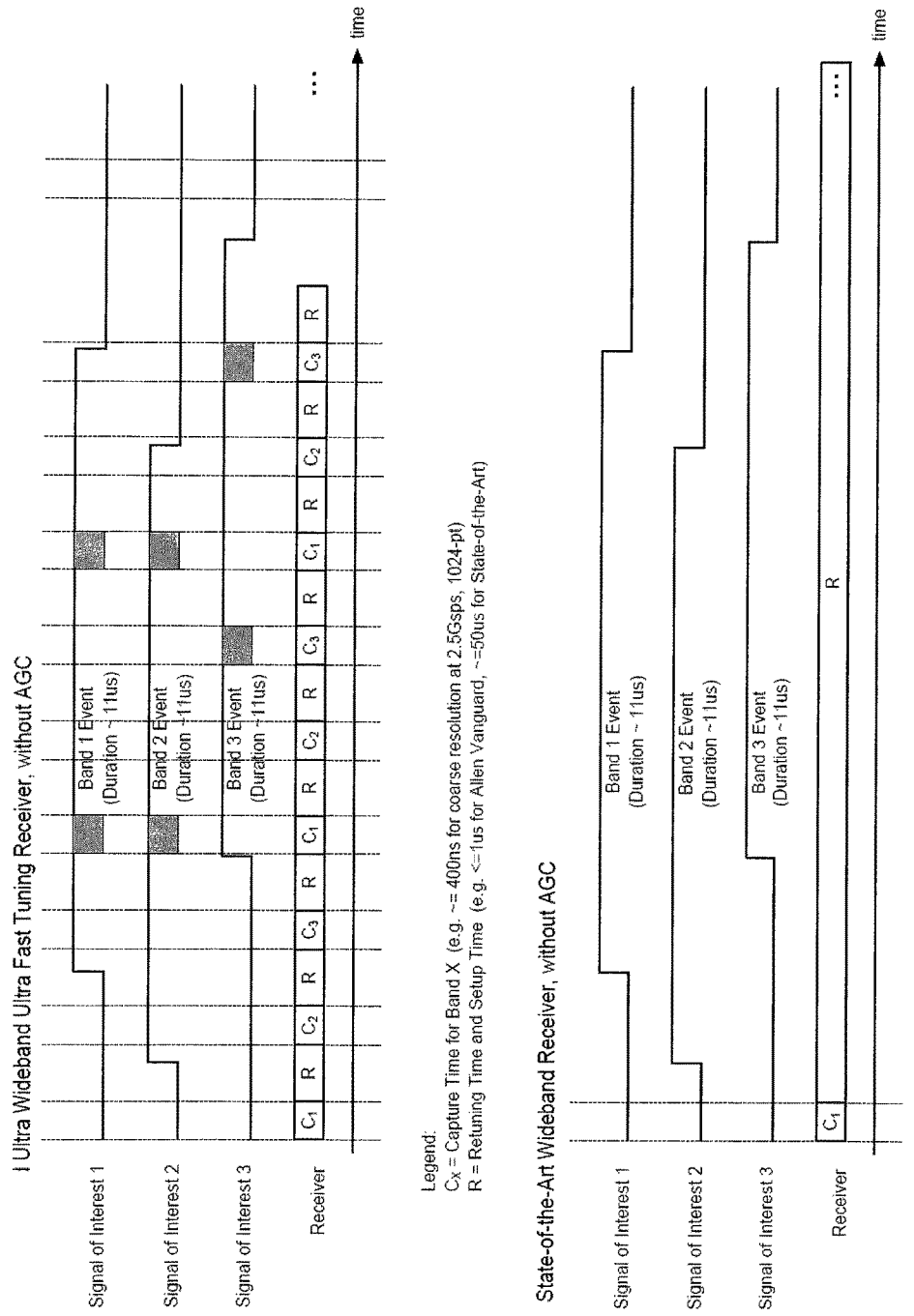
Figure 6:
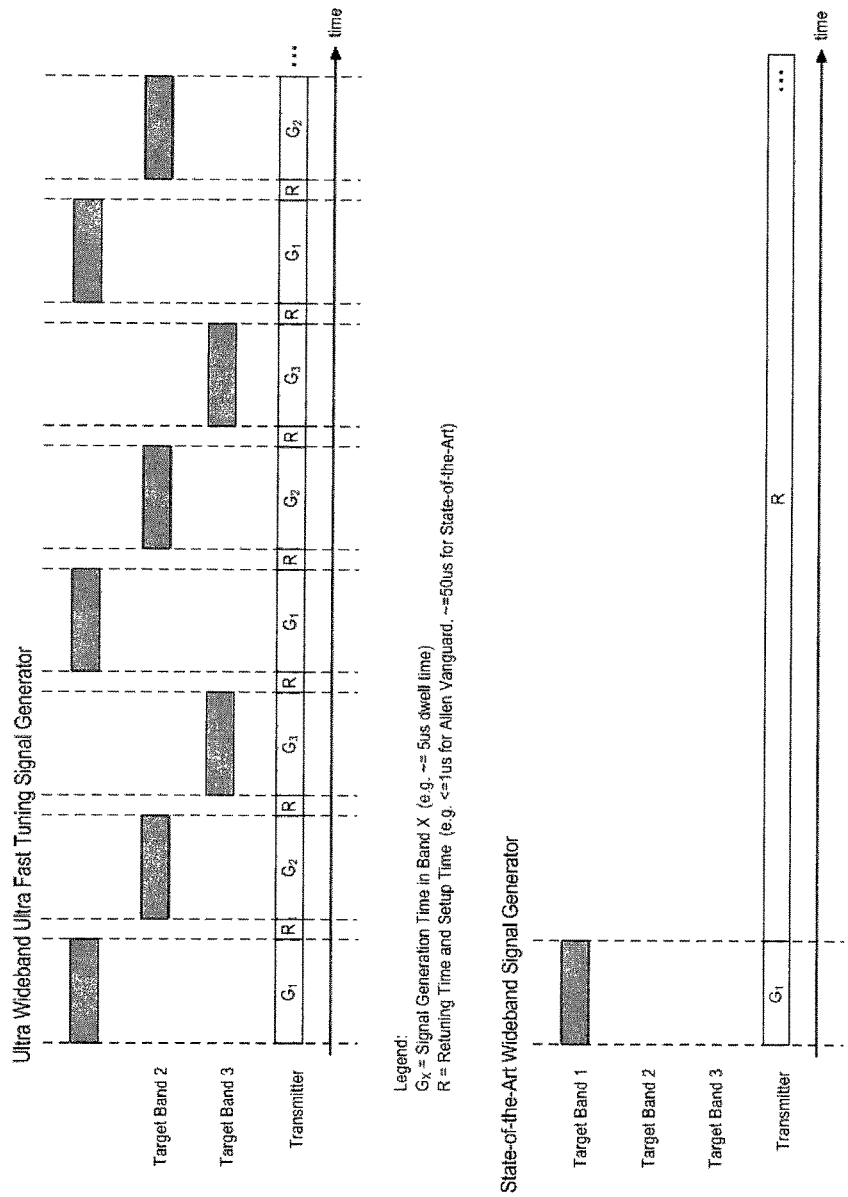
FIG. 6 illustrates the ability of the invention to target multiple bands in a much shorter timeframe as compared to the prior art.

FIGS. 4, 5 and 6 show test results of a system as herein described versus that of a prior art system. FIG. 4 shows three different signals of interest, and the benefits of a fast revisit time as provided by the invention. The top chart in FIG. 4 shows the system of the invention in one full cycle having an automatic gain control time of approximately 2 μs, an available capture time in the order of 400 ns, and a return and setup time of less than 1 μs to modify the seek frequency. As shown, each of the three signals of interest having a relatively short duration of 11 μs are detected at the appropriate frequency at either $C_1$, $C_2$, or $C_3$. This is a direct result of having minimized the return and set-up time for scanning the next frequency. The chart at the bottom of FIG. 4 shows a prior art system having a return and set-up time of approximately 50 μs. As shown, only one of the signals of interest are detected by the prior art system. The signals of interest shown are each at a particular, and different bandwidth. As will also be evident, switching bands in the prior art system takes a significantly longer time and runs the credible risk of missing a signal of interest altogether, particularly in military and defense applications as discussed above where these differences can be critical.

FIG. 5 show another comparison in which the automatic gain control has been omitted, allowing for even lower cycle times, and permitting for two captures on each signal of interest when compared to the results in FIG. 4. It is possible to operate without automatic gain control by either restricting the dynamic operating range or by performing gain control using the captured data instead of a separate control loop, for example. Again, the prior art system is incapable of detecting more than one signal of interest, even with the gain control removed.

FIG. 6 shows that for applications such as electronic attack it is possible to target multiple bands (i.e. requires retuning) in a much shorter timeframe. With a short signal (may be a sweep, spot or arbitrary waveform signal) of 5 us a system employing the invention can move quickly between bands using the disclosed transmitter architecture. For a longer retuning time it becomes impractical to attack multiple frequency bands since the retuning time eclipses the time on target. This is shown in the state-of-the-art signal generator scenario where switching bands takes much longer than the time on target. Prior art systems would need to use multiple transmitters, thus increasing cost to alleviate their shortcomings.

The invention is also applicable to the area of signal generation across a single wide frequency range or multiple frequency ranges. In particular the ability to task a single signal generation source to address multiple bands very quickly allows for cost reduction through a reduction of multiple signal generators down to one. This can greatly reduce system costs not just in the signal generator itself but in connected power amplifiers, switches, diplexors and antennas. These rapid signal generation sources can also be used for cognitive radio allowing for relocation of the signal source across a wide range of frequencies exceeding that offered by the bandwidth of the digital to analog converter (DAC).

Other modifications and alterations may be used in the design and manufacture of other embodiments according to the present invention without departing from the spirit and scope of the invention, which is limited only by the accompanying claims.

We claim:

1. A system for radio transmission comprising:
    a direct digital synthesis (DDS) signal generator providing a signal within a first bandwidth;
    a frequency multiplier in signal communication with said DDS signal generator; said frequency multiplier adapted to convert said signal within said first bandwidth to a multiplied signal within a second bandwidth, wherein said second bandwidth encompasses a wider frequency range than said first bandwidth;
    a processor in communication with said DDS signal generator for programming said DDS signal generator to provide said signal within said first bandwidth; said processor further adapted to reprogram said DDS signal generator to alter said first bandwidth;
    a radio frequency (RF) port for transmitting said signal as a wideband signal; and,
    a radio frequency (RF) mixer for mixing an intermediate frequency signal with said multiplied signal to generate an RF signal; said RF port transmitting said RF signal as said wideband signal;
    wherein said processor is adapted to reprogram said DDS signal generator in less than 1 µs (microsecond).

2. The system according to claim 1, further comprising:
    a digital-analog converter (DAC) for receiving a digital signal to be transmitted and converting said digital signal into an analog signal;
    a data converter/mixer for converting said analog signal to an intermediate frequency signal.

3. The system according to claim 2, further comprising one or more of:
    a bandpass filter between said DDS signal generator and said frequency multiplier;
    an RF bandpass filter between said RF mixer and said RF port; and
    a DAC bandpass filter between said data converter/mixer and said RF mixer.

4. The system according to claim 1, wherein said first bandwidth is in the range of DC (direct current) to 1.6 GHz.

5. The system according to claim 4, wherein said second bandwidth is in the range of DC to 6 GHz.

6. A system for radio transmission scanning comprising:
    a radio frequency (RF) port for receiving an incoming wideband signal;
    a direct digital synthesis (DDS) signal generator providing a signal within a first bandwidth;
    a frequency multiplier in signal communication with said DDS signal generator; said frequency multiplier adapted to convert said signal within said first bandwidth to a multiplied signal within a second bandwidth, wherein said second bandwidth encompasses a wider frequency range than said first bandwidth;
    a processor in communication with said DDS signal generator for programming said DDS signal generator to provide said signal within said first bandwidth; said processor further adapted to reprogram said DDS signal generator to alter said first bandwidth;
    a radio frequency (RF) mixer for mixing said incoming wideband signal with said multiplied signal to generate an intermediate frequency signal;
    a data converter/mixer for converting said intermediate frequency signal into a baseband frequency signal; and,
    an analog-digital converter (ADC) for receiving said baseband frequency signal and converting said baseband frequency signal into a digital signal;
        wherein said processor is adapted to reprogram said DDS signal generator in less than 1 µs (microsecond).

7. The system according to claim 6, further comprising one or more of:
    a bandpass filter between said DDS signal generator and said frequency multiplier;
    an RF bandpass filter between said RF mixer and said RF port; and a DAC bandpass filter between said data converter/mixer and said RF mixer.

8. The system according to claim 6, wherein said first bandwidth is in the range of DC (direct current) to 1.6 GHz.

9. The system according to claim 6, wherein said second bandwidth is in the range of DC to 6 GHz.

10. The system according to claim 1, wherein said processor is adapted to reprogram said DDS signal generator within less than 50 µs.

11. The system according to claim 6, wherein said processor is adapted to reprogram said DDS signal generator within less than 50 µs.

* * * * *